(12) United States Patent
Yeh

(10) Patent No.: US 9,997,689 B2
(45) Date of Patent: Jun. 12, 2018

(54) CHIP REDUCING THERMAL STRESS OF CURRENT PATH THEREON

(71) Applicant: National Tsing Hua University, Hsinchu (TW)

(72) Inventor: Jer-Liang Yeh, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days. days.

(21) Appl. No.: 15/652,008

(22) Filed: Jul. 17, 2017

(65) Prior Publication Data

US 2018/0062053 A1 Mar. 1, 2018

(30) Foreign Application Priority Data

Aug. 24, 2016 (TW) .............................. 105127157 A

(51) Int. Cl.
*H01L 33/00* (2010.01)
*H01L 33/62* (2010.01)
*H01L 29/06* (2006.01)

(52) U.S. Cl.
CPC .......... *H01L 33/62* (2013.01); *H01L 29/0676* (2013.01)

(58) Field of Classification Search
USPC ......... 257/99, 41, 81, 82, 91, 177–182, 276, 257/457, 459, 502, 503, 573, 584, 602, 257/621, 664–677, 688–700, 734–786, 257/E23.01–E23.079, E23.141–E23.179; 438/82, 98, 100, 101, 111, 112, 123, 124, 438/411, 412, 461, 584, 597–688
See application file for complete search history.

(56) References Cited

U.S. PATENT DOCUMENTS

| | | | |
|---|---|---|---|
| 2011/0281070 A1* | 11/2011 | Mittal | ............ H01L 31/022466 428/142 |
| 2012/0122278 A1 | 5/2012 | Lee | |
| 2014/0166974 A1* | 6/2014 | Yoo | ........................ H01L 33/08 257/13 |

FOREIGN PATENT DOCUMENTS

TW I316750 11/2009

* cited by examiner

*Primary Examiner* — Tram H Nguyen
(74) *Attorney, Agent, or Firm* — Guice Patents PLLC

(57) ABSTRACT

A chip reducing thermal stress of current path thereon, including: a substrate having at least one nanowires zone formed on a surface thereof; and at least one current path formed within the at least one nanowires zone on the surface of the substrate, wherein, the at least one nanowires zone has a function of reducing a thermal stress of the at least one current path.

9 Claims, 9 Drawing Sheets

CHIP REDUCING THERMAL STRESS OF CURRENT PATH THEREON

BACKGROUND OF THE INVENTION

Field of the Invention

The present invention relates to a chip reducing thermal stress of a current path thereon, especially to a chip reducing thermal stress of a current path thereon by surrounding the current path with nanowires structures.

Description of the Related Art

Chips can be damaged by a thermal stress caused by soldering during a manufacturing process or caused by an operation current when in use. To solve the thermal stress damage problem caused by soldering, one traditional solution is to use large soldering areas. For example, Taiwan patent TWI316750 discloses a flip-chip package structure and a manufacture method thereof, characterizing in that: by installing multiple heat dissipating blocks between a flip-chip and a package board, or by implementing large soldering areas on the work surface of a flip-chip, or by implementing large soldering areas on the work surface of a package board, the heat dissipating paths can be increased with large contact areas installed between the flip-chip and the package board to make the work surface of the flip-chip capable of enduring a larger thermal stress.

Besides, another way of reducing the thermal stress caused by soldering can be seen in US patent US 20120122278A1, which discloses a method of manufacturing a semiconductor package board, including: providing a substrate including a connection part formed on one side thereof, the connection part being provided thereon with a solder layer; disposing a conductive heat generator equipped with current wiring on the solder layer; applying current to the current wiring and thus heating the solder layer attach a semiconductor chip to the connection part; and removing the current wiring from the conductive heat generator. The method is advantageous in that the semiconductor chip is attached to the substrate by applying current to the current wiring of the conductive heat generator to locally heat only the solder layer, thus reducing the thermal stress and preventing the deformation of the substrate.

However, not only the thermal stress caused by soldering can damage the chips, but the thermal stress caused by an operation current can also damage the chips. In fact, when an operation current flows through a current path on a chip, a thermal stress will result at interfaces between the current path and a substrate of the chip, or at shape discontinuities of the current path. When the thermal stress exceeds a threshold, the current path can be lifted off the substrate or fracture at the shape discontinuities of the current path.

To prevent chips from being damaged by the thermal stress caused by an operation current, a general way is to increase the size of the current path. However, this general way will lead to reduction of the number of chips per wafer, and thereby increase the manufacturing cost per chip.

To solve the foregoing problems, a novel chip capable of reducing the thermal stress of a current path thereon is needed.

SUMMARY OF THE INVENTION

One objective of the present invention is to disclose a chip capable of reducing the thermal stress of a current path thereon by surrounding the current path with nanowires structures to dissipate the thermal stress caused by a current flowing through the current path.

Another objective of the present invention is to disclose a chip capable of reducing the thermal stress of a current path thereon by surrounding the current path with nanowires structures, so as to prevent the current path from getting broken or lifted off a substrate by the thermal stress, and thereby prolong the operational life of the chip.

Another objective of the present invention is to disclose a chip capable of reducing the thermal stress of a current path thereon by surrounding the current path with nanowires structures, so as to increase the maximum rated current of the current path.

Still another objective of the present invention is to disclose a chip capable of reducing the thermal stress of a current path thereon by surrounding the current path with nanowires structures, so that a smaller size of the current path can be used for a rated current.

To attain the foregoing objectives, a chip reducing thermal stress of current path thereon is proposed, including:

a substrate having a surface formed with at least one nanowires zone; and at least one current path formed on the surface of the substrate and being within the at least one nanowires zone.

In one embodiment, the at least one nanowires zone includes nanowires structures having a depth ranging from 1 μm to 5 μm, and each side wall of the at least one current path neighbors the nanowires structures, so that a thermal stress of each of the at least one current path can be dissipated.

In one embodiment, the at least one nanowires zone is implemented by an etching process.

In one embodiment, the at least one nanowires zone is implemented by an electrochemical process.

In one embodiment, the at least one nanowires zone is implemented by a deposition process.

In one embodiment, the at least one current path is implemented by aluminum or copper.

In one embodiment, the at least one current path is implemented by a semiconductor material.

In one embodiment, the chip includes at least one power switching device.

In one embodiment, the chip includes at least one LED device.

In one embodiment, the chip includes at least one solar cell.

In one embodiment, the substrate is a silicon substrate.

In one embodiment, the substrate is a sapphire substrate.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

The present invention is based on a principle that, by surrounding a current path on a chip with nanowires structures, the thermal stress caused by a current flowing through the current path can be dissipated through the nanowires structures.

Figure 1:
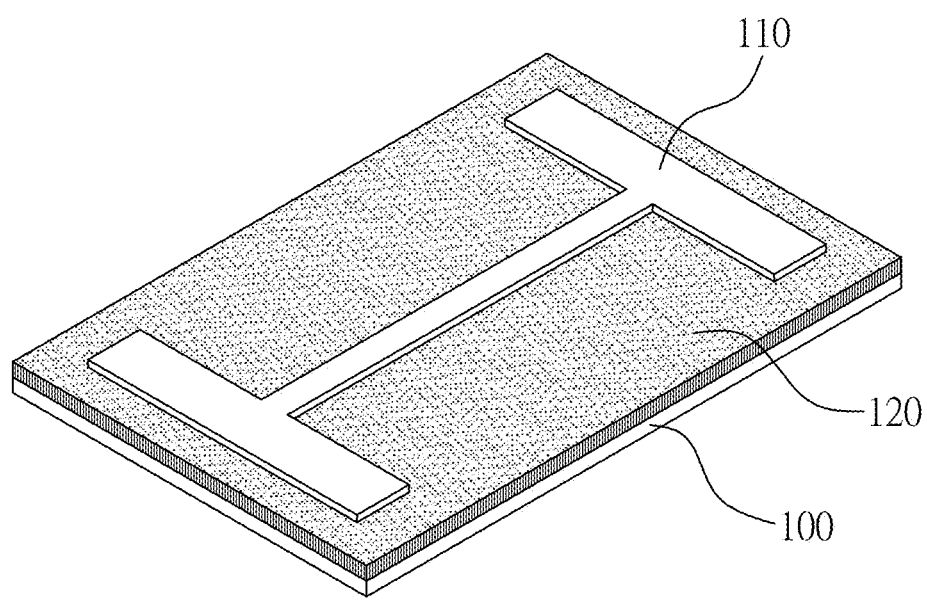
FIG. 1 illustrates a local outline of a chip reducing thermal stress of current path according to one embodiment of the present invention.

Please refer to FIG. 1, which illustrates a local outline of a chip reducing thermal stress of current path according to one embodiment of the present invention, the chip including a substrate 100, at least one current path 110, and at least one nanowires zone 120 that surrounds the at least one current path 110.

The substrate 100 can be a silicon substrate or a sapphire substrate.

The current path 110 can be implemented by aluminum, copper, or other conductors, or by a semiconductor material.

Figure 2A:
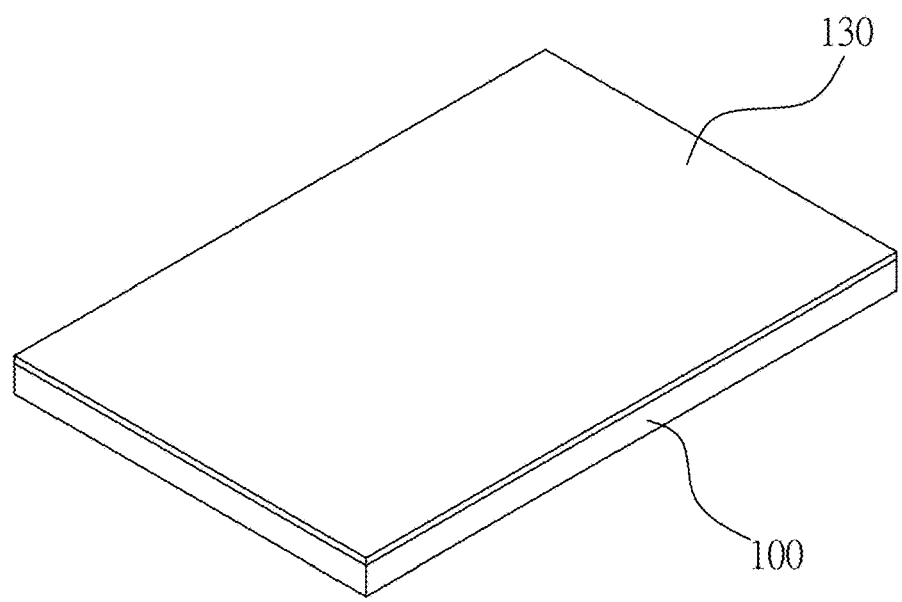
FIG. 2a-2c illustrates a manufacturing process for implementing the nanowires zone of the chip of FIG. 1 according to one embodiment of the present invention.
Figure 2B:
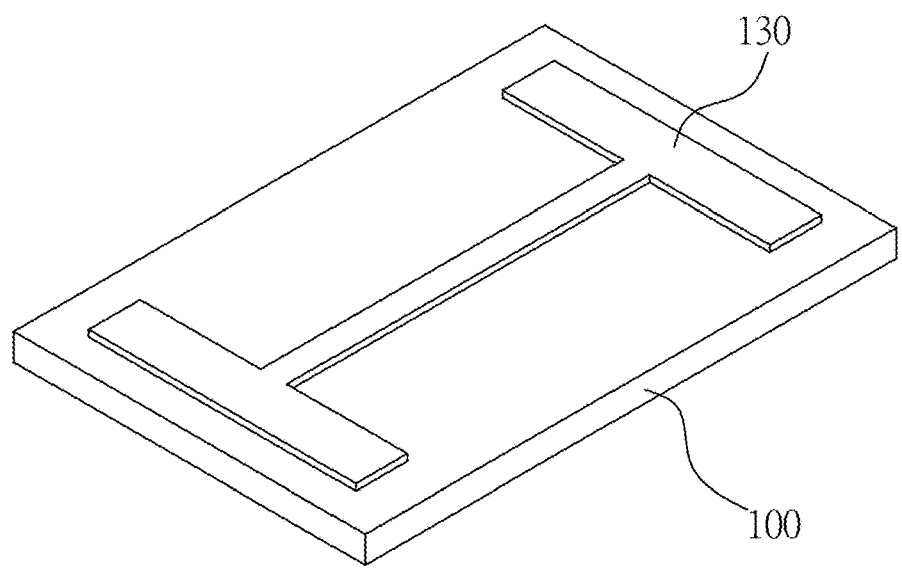
Figure 2C:
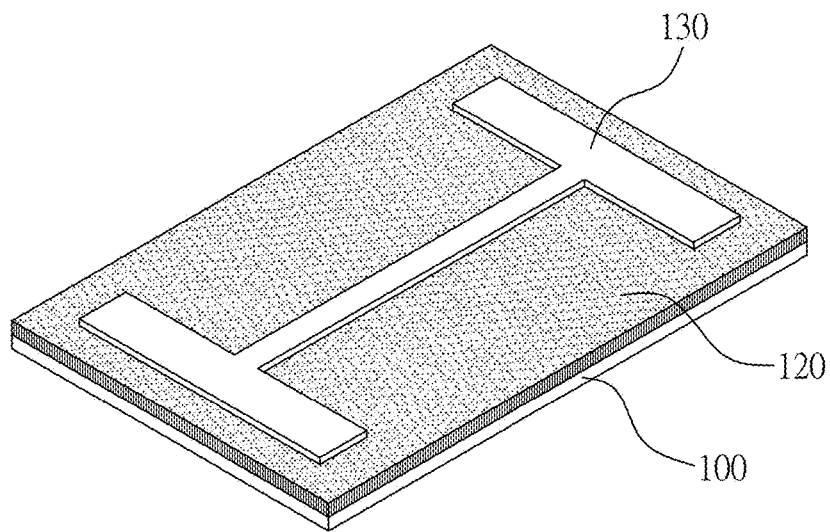
Figures 2D, 2E, 2F:
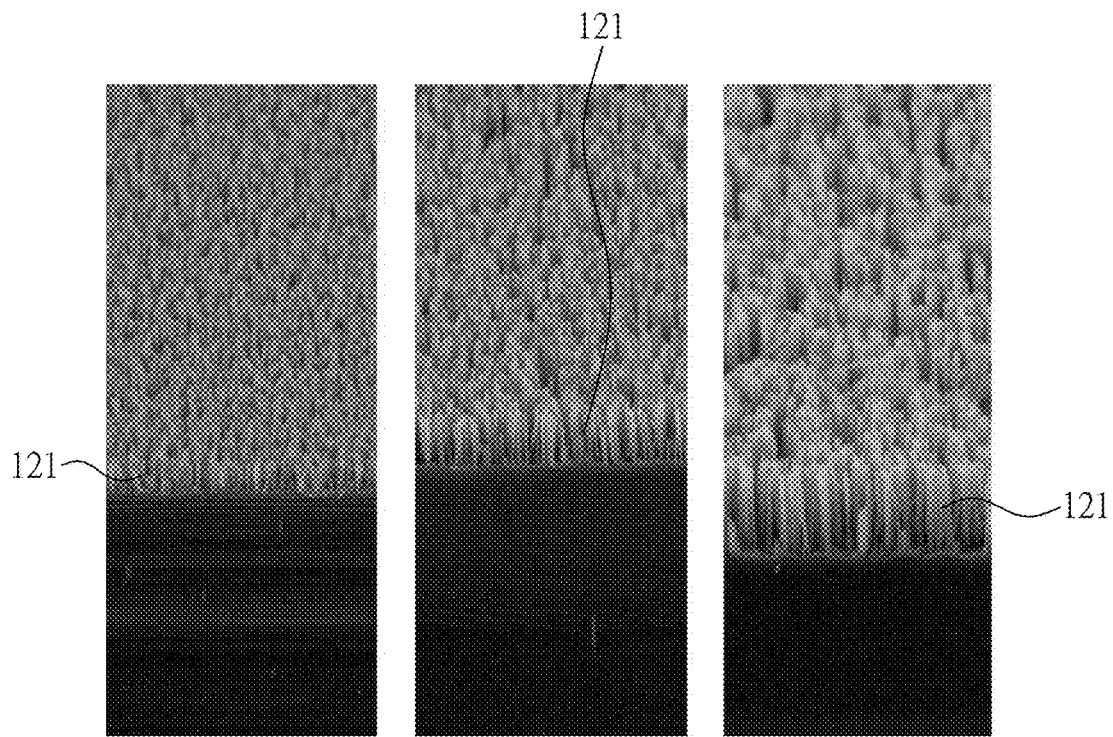
FIG. 2d-2f illustrates different depths of nanowires structures caused by an etching process with different active times of 10 minutes, 20 minutes, and 30 minutes respectively.

The nanowires zone 120 includes nanowires structures having a depth ranging from 1 μm to 5 μm, and each side wall of the at least one current path 110 neighbors the nanowires structures, so that a thermal stress of each of the at least one current path 110 can be dissipated. Please refer to FIG. 2a-2c, which illustrates a manufacturing process for implementing the nanowires zone 120 of the chip of FIG. 1 according to one embodiment of the present invention, the manufacturing process including: placing a layer of photoresist 130 on the substrate 100 (as illustrated in FIG. 2a); using an exposure process to form a pattern (as illustrated in FIG. 2b); and using an etching process to form nanowires structures within the nanowires zone 120 (as illustrated in FIG. 2c). The depth of the nanowires structures can be controlled by the active time of the etching process. Please refer to FIG. 2d-2f, which illustrates different depths of 1.1 μm, 2.3 μm, and 3.2 μm of nanowires structures caused by the etching process with different active times of 10 minutes, 20 minutes, and 30 minutes respectively.

Figure 3A:
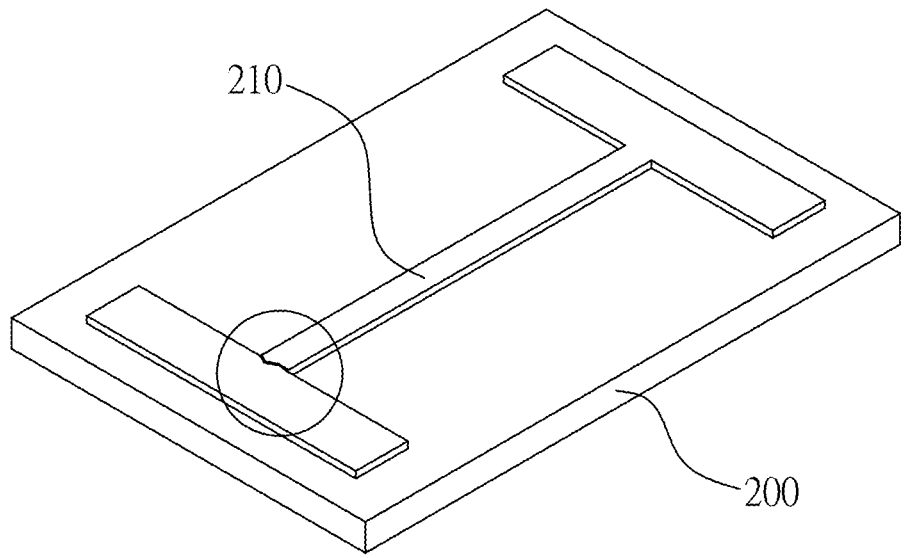
FIG. 3a illustrates a conventional chip having a current path broken at a shape discontinuity due to a thermal stress.
Figure 3B:
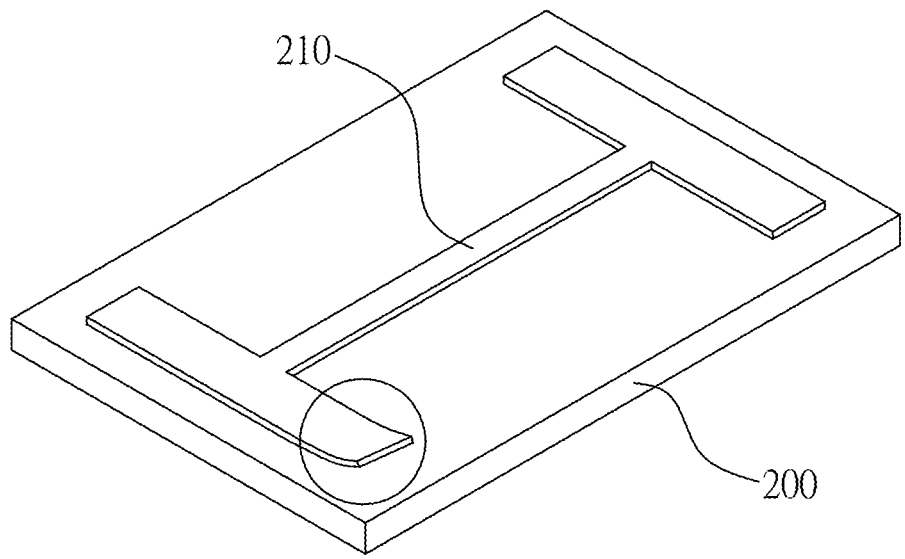
FIG. 3b illustrates a conventional chip having a current path lifted off a substrate due to a thermal stress.

As mentioned above, when an operation current flows through a current path of a conventional chip, a thermal stress will result at interfaces between the current path and a substrate or at shape discontinuities of the current path, and when the thermal stress exceeds a threshold, the current path may be lifted off the substrate or get broken at the shape discontinuities. Please refer to FIG. 3a, which illustrates a conventional chip having a current path 210 broken at a shape discontinuity (as indicated in a circled area) due to a thermal stress; and FIG. 3b, which illustrates a conventional chip having a current path 210 lifted off a substrate 200 (as indicated in a circled area) due to a thermal stress. In comparison, by installing nanowires structures around the current path 110, the present invention can effectively prevent the current path 110 from getting broken or lifted off the substrate 100 by the thermal stress, and thereby prolong the operational life of the chip, and increase the maximum rated current of the current path 110 that the current path 110 can endure.

Besides, by installing nanowires structures around the current path 110, the current path 110 of the present invention can be smaller in size than the current path of conventional chips to carry a rated current, so as to increase the number of chips per wafer, and thereby decrease the manufacturing cost per chip.

Besides, in practical applications, the chip can include at least one power switching device, at least one LED (light emitting diode) device, at least one solar cell, or other devices that require large operation currents.

Figure 4A:
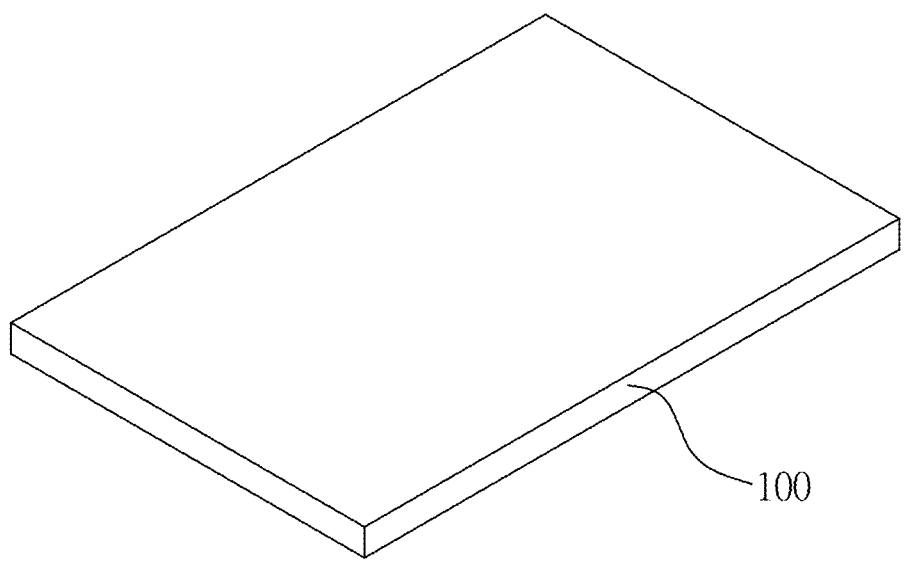
FIG. 4a-4g illustrates a manufacturing process for implementing the chip of the present invention according to one embodiment.
Figure 4B:
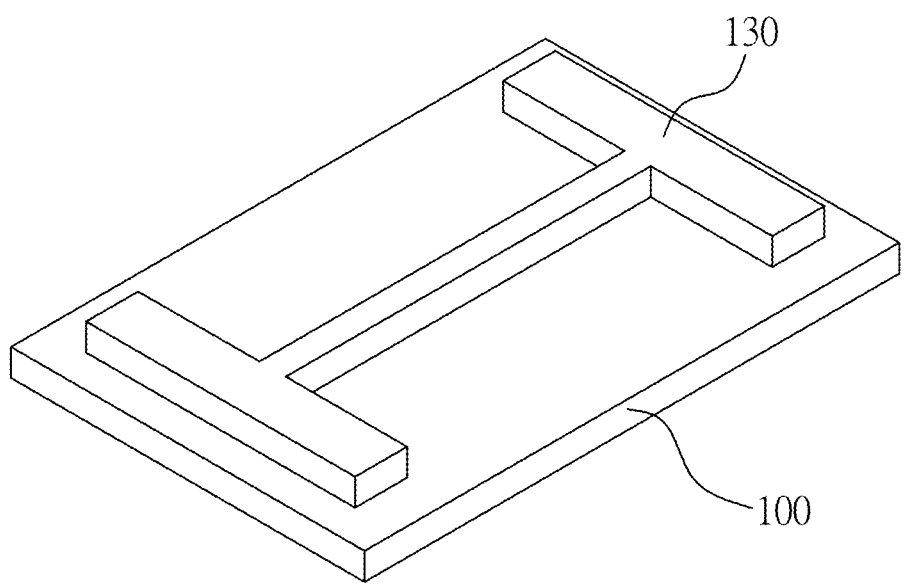
Figure 4C:
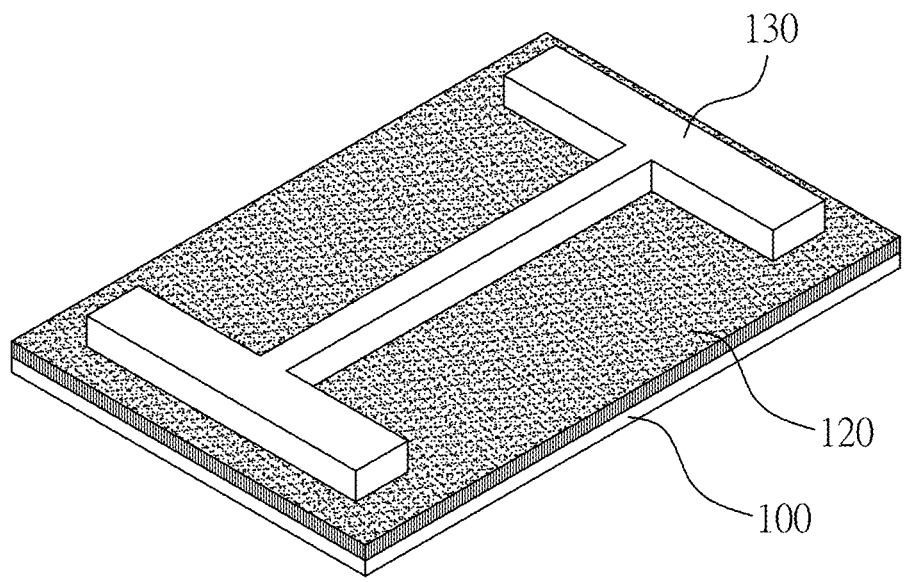
Figure 4D:
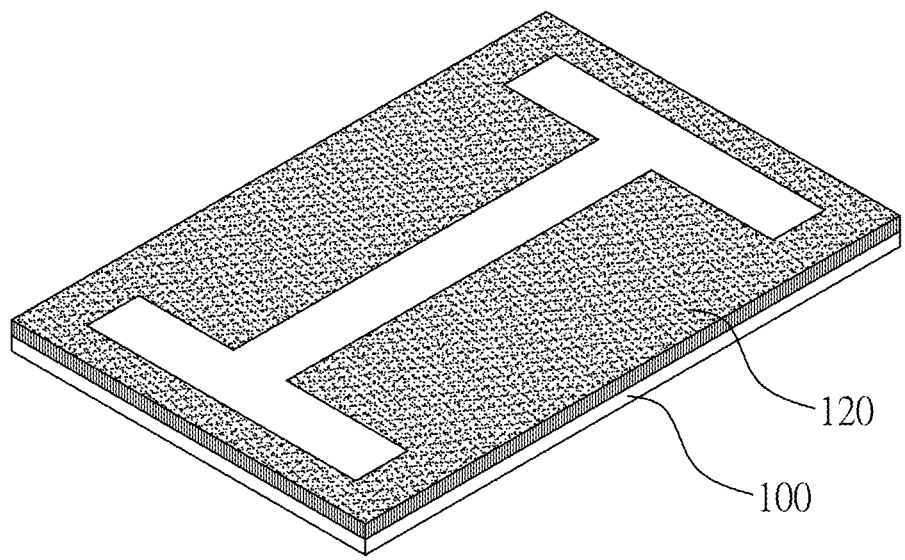
Figure 4E:
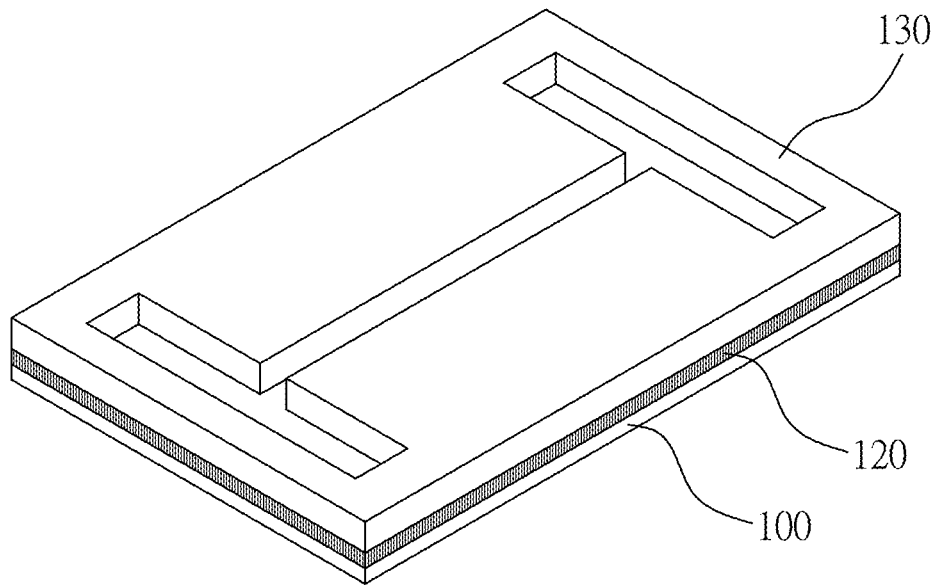
Figure 4F:
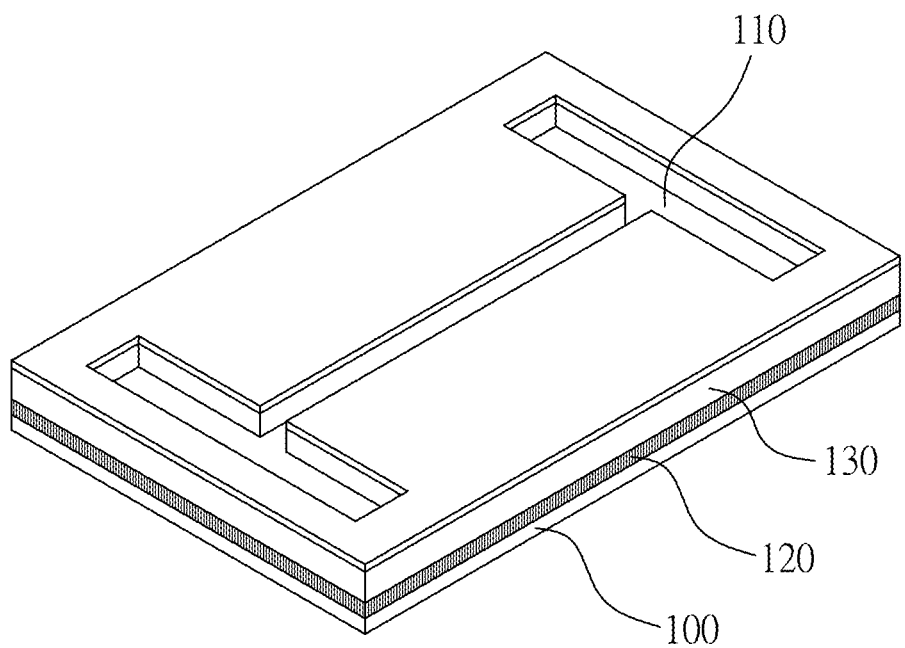
Figure 4G:
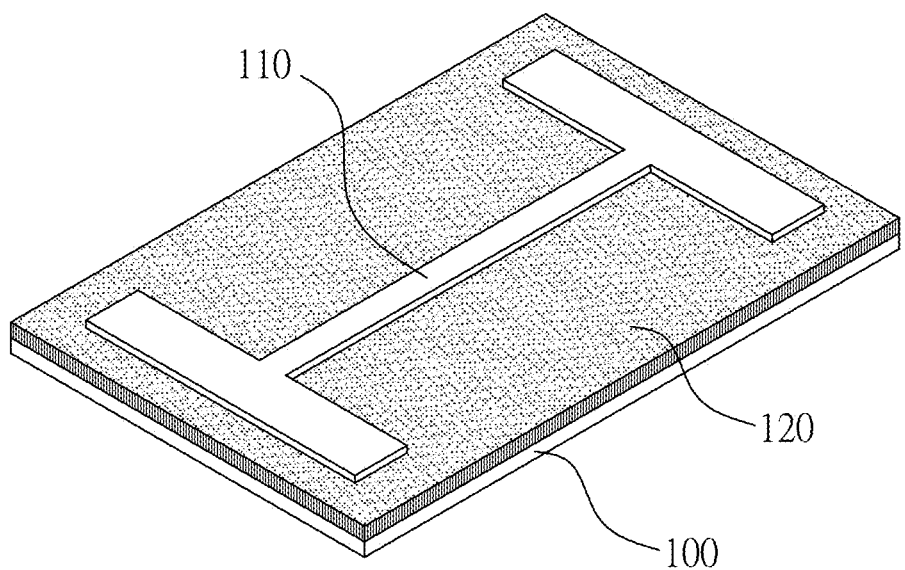

Besides, the nanowires zone and the current path can be formed on a substrate by using a semiconductor manufacturing process. Please refer to FIG. 4a-4g, which illustrates a manufacturing process for implementing the chip of the present invention according to one embodiment, the manufacturing process including: preparing a substrate 100 (as illustrated in FIG. 4a); forming a patterned layer of photoresist 130 on the substrate 100 (as illustrated in FIG. 4b); using an etching process to form a nanowires zone 120 (as illustrated in FIG. 4c); removing the patterned layer of photoresist 130 (as illustrated in FIG. 4d); forming another patterned layer of photoresist 130 (as illustrated in FIG. 4e); depositing a layer of metal to form the current path 110 (as illustrated in FIG. 4f); and using a lift-off process to remove the patterned layer of photoresist 130 and the metal thereon. Although the nanowires zone 120 is formed before the current path 110 in the manufacturing process illustrated in FIG. 4a-4g, the present invention is not limited thereto. In another embodiment, the current path 110 can be formed before the nanowires zone 120. Besides, apart from the etching process, the nanowires zone 120 can also be formed by using an electrochemical process or a deposition process.

Figure 5:
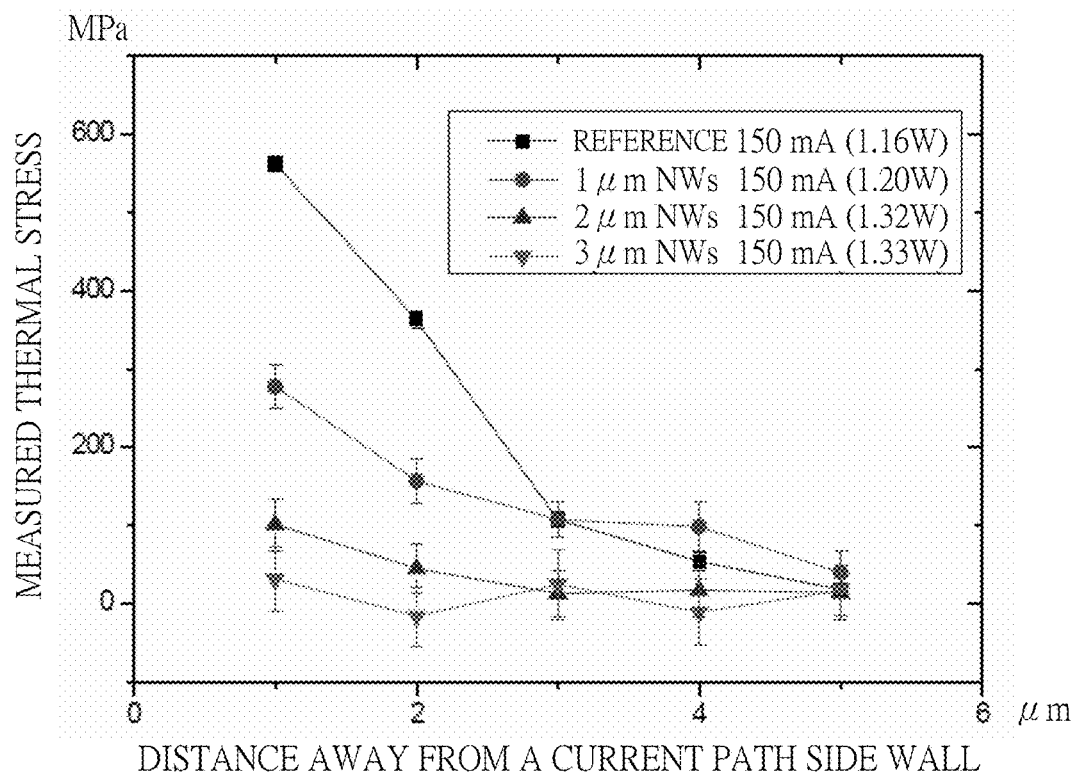
FIG. 5 illustrates three measured thermal stress profiles of three chips of the present invention (having nanowires structures of 1 μm in depth, 2 μm in depth, and 3 μm in depth respectively) in comparison with a measured thermal stress profile of a conventional chip.

Please refer to FIG. 5, which illustrates three measured thermal stress profiles of three chips of the present invention (having nanowires structures of 1 μm in depth, 2 μm in depth, and 3 μm in depth respectively) in comparison with a measured thermal stress profile of a conventional chip (as a reference for the measured thermal stress profiles of the chips of the present invention to compare with) that does not have nanowires structures. As illustrated in FIG. 5, obviously, the measured thermal stress values at locations 1 μm to 2 μm away from a side wall of a current path of the chips of the present invention are much smaller than the measured thermal stress values at corresponding locations (1 μm to 2 μm away from a side wall of a current path) of a conventional chip; that is, by surrounding a current path with nanowires structures to provide a thermal stress dissipating function, the chip of the present invention is indeed capable of reducing the thermal stress caused by an operation current.

Thanks to the proposal mentioned above, the present invention possesses the following advantages:

1. The chip of the present invention is capable of reducing the thermal stress of a current path thereon by surrounding the current path with nanowires structures to dissipate the thermal stress caused by a current flowing through the current path.

2. The chip of the present invention is capable of reducing the thermal stress of a current path thereon by surrounding the current path with nanowires structures, so as to prevent the current path from getting broken or lifted off a substrate by the thermal stress, and thereby prolong the operational life of the chip.

3. The chip of the present invention is capable of reducing the thermal stress of a current path thereon by surrounding the current path with nanowires structures, so as to increase the maximum rated current of the current path.

4. The chip of the present invention is capable of reducing the thermal stress of a current path thereon by surrounding the current path with nanowires structures, so that a smaller size of the current path can be used for a rated current, and thereby increase the number of chips per wafer.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance over the conventional structure and further complies with the patent application requirements and is submitted to the Patent and Trademark Office for review and granting of the commensurate patent rights.

What is claimed is:

1. A chip reducing thermal stress of current path thereon, including:
   a substrate having a surface formed with at least one nanowires zone; and
   at least one current path formed on the surface of the substrate and being within the at least one nanowires zone;
   wherein the at least one nanowires zone includes nanowires structures having a depth ranging from 1 μm to 5 μm, and each side wall of the at least one current path neighbors the nanowires structures, so that a thermal stress of each of the at least one current path can be dissipated.

2. The chip reducing thermal stress of current path thereon as disclosed in claim 1, wherein the at least one nanowires zone is implemented by a process selected from a group consisting of an etching process, an electrochemical process, and a deposition process.

3. The chip reducing thermal stress of current path thereon as disclosed in claim 1, wherein the at least one current path is implemented by aluminum or copper.

4. The chip reducing thermal stress of current path thereon as disclosed in claim 1, wherein the at least one current path is implemented by a semiconductor material.

5. The chip reducing thermal stress of current path thereon as disclosed in claim 1, wherein the chip includes at least one power switching device.

6. The chip reducing thermal stress of current path thereon as disclosed in claim 1, wherein the chip includes at least one LED device.

7. The chip reducing thermal stress of current path thereon as disclosed in claim 1, wherein the chip includes at least one solar cell.

8. The chip reducing thermal stress of current path thereon as disclosed in claim 1, wherein the substrate is a silicon substrate.

9. The chip reducing thermal stress of current path thereon as disclosed in claim 1, wherein the substrate is a sapphire substrate.

\* \* \* \* \*